United States Patent
Lin et al.

(10) Patent No.: US 7,707,536 B2
(45) Date of Patent: Apr. 27, 2010

(54) V-SHAPED MULTILEVEL FULL-CHIP GRIDLESS ROUTING

(75) Inventors: Shyh-Chang Lin, Hsin-Chu (TW);
Tai-Chen Chen, Taoyuan (TW);
Yao-Wen Chang, Taipei (TW);
Feng-Yuan Chang, Da-an Township (TW)

(73) Assignee: Springsoft USA, Inc., San Jose, CA (US)

( * ) Notice: Subject to any disclaimer, the term of this patent is extended or adjusted under 35 U.S.C. 154(b) by 187 days.

(21) Appl. No.: 11/681,859

(22) Filed: Mar. 5, 2007

(65) Prior Publication Data
US 2007/0256045 A1 Nov. 1, 2007

Related U.S. Application Data

(60) Provisional application No. 60/795,967, filed on Apr. 28, 2006.

(51) Int. Cl.
*G06F 17/50* (2006.01)
(52) U.S. Cl. ............... 716/12; 716/1; 716/2; 716/8; 716/9; 716/13; 716/14
(58) Field of Classification Search ........... 716/8–14, 716/1–2
See application file for complete search history.

(56) References Cited

U.S. PATENT DOCUMENTS

| | | | |
|---|---|---|---|
| 6,735,754 B2 * | 5/2004 | Mehrotra et al. | 716/13 |
| 7,065,730 B2 * | 6/2006 | Alpert et al. | 716/13 |
| 7,603,640 B2 * | 10/2009 | Lin et al. | 716/7 |
| 2001/0014965 A1 * | 8/2001 | Hiraga | 716/13 |

* cited by examiner

*Primary Examiner*—Jack Chiang
*Assistant Examiner*—Nghia M Doan
(74) *Attorney, Agent, or Firm*—Chernoff, Vilhauer, McClung & Stenzel (57) ABSTRACT

A router organizes an IC area into an array of global routing cells (GRCs) and generates a congestion map providing a separate congestion factor for each GRC boundary. The router then iteratively partitions the IC area into progressively smaller tiles while selecting a route for each net passing between tiles when possible without altering any previously routed net. The router thereafter iteratively merges the tiles into progressively larger tiles while selecting a route for each previously unrouted net residing wholly within a single tile, altering routes of previously routed nets when necessary to accommodate the selected route. When selecting each route for any connection of a net, the router seeks to minimize a cost function of congestion factors of all GRC boundaries.

24 Claims, 6 Drawing Sheets

V-SHAPED MULTILEVEL FULL-CHIP GRIDLESS ROUTING

CROSS-REFERENCE TO RELATED APPLICATION

This application claims benefit of U.S. Provisional Application 60/795,967 entitled "V-Shaped Multilevel Framework," filed Apr. 28, 2006

BACKGROUND OF THE INVENTION

1. Field of the Invention

The invention relates to a method for routing nets within an integrated circuit (IC) layout by iteratively partitioning the layout into progressively smaller tiles, routing each net crossing a tile boundary after each partitioning without altering any previously routed net, then iteratively partitioning the layout into progressively larger tiles, routing each previously unrouted net crossing a tile boundary after each partitioning, altering existing net routes when necessary.

2. Description of Related Art

IC fabricators provide cell libraries describing a set of standard cells that an IC designer can incorporate into an IC design. Each standard cell is an IC component of proven design such as, for example, a transistor, a logic gate, an input/output port, or a more complicated device such as a memory. An IC designer typically develops an IC design in the form of a "netlist", a data file describing the IC as a collection of instances of cells and indicating which terminals of the cells are to be interconnected by signal paths ("nets"). The IC designer employs a computer-aided placement and routing tool employing placement algorithm that processes the netlist to produce a placement plan indicating a position of each cell instance within the IC and a routing algorithm to produce a routing plan indicating a route for each net interconnecting cells instances. Placement and routing is typically an iterative process; if the routing algorithm fails to find a route for each net, the placement algorithm modifies the placement plan and the routing algorithm and again attempts to find a route for each net. An efficient routing algorithm that is more likely to find a route for each net when possible for a given placement plan, and which does so quickly, can greatly reduce the processing time needed for placement and routing.

Figure 1:
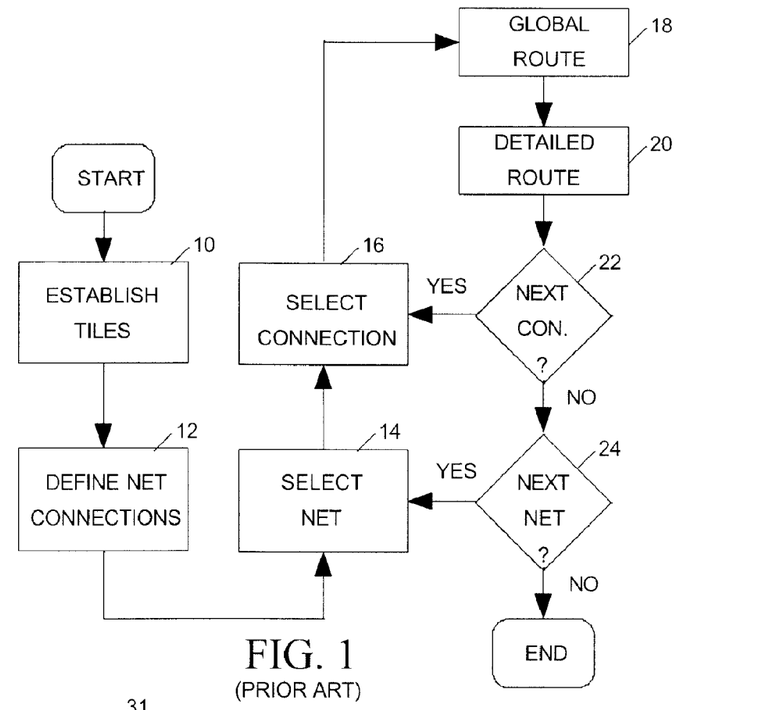
FIG. 1 is a flow chart depicting a prior art routing method.
Figure 2A:
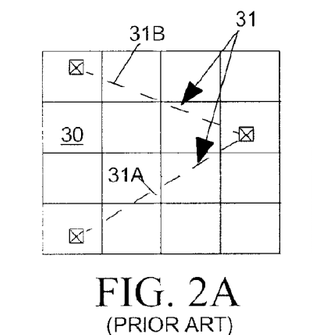
FIGS. 2A-2F graphically depict stages of a prior art routing method.
Figure 2B:
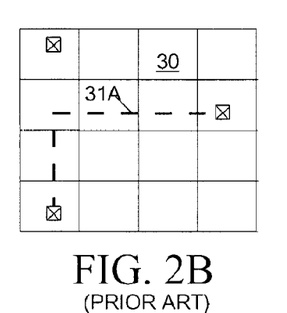
Figure 2C:
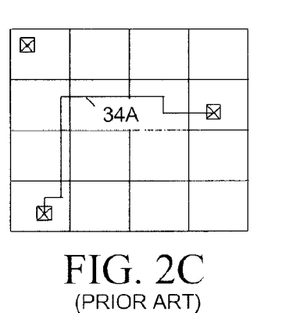

FIG. 1 illustrates a simple routing algorithm that divides the IC layout area into an array of rectangular tiles 30 (step 10) as shown in FIG. 2A. A router implementing the routing algorithm then processes the netlist to define a set of connections for each net (step 12). A "connection" is a signal path between two cell terminals. For example, a net connecting only two cell terminals consists of a single connection while a net connecting four cell terminals consists of three connections. FIG. 2A shows an unrouted net 31 consisting of two connections 31A and 31B connecting terminals of three cells 32, 33 and 34. After defining all connections (step 12), the router selects one of the unrouted nets (step 14) and a first connection of that net (step 16), and then determines a global route for that connection (step 18). For example FIG. 2B shows that with net 31 selected at step 14 and connection 31A selected at step 16, a global route is selected for connection 31A. A "global route" for a connection is simply a list of the particular tiles through which the net is to pass that does not indicate the exact ("detailed") route of the connection through any individual tile. The router will typically look for a route that minimizes a routing cost function related to the density of connections crossing the individual tile boundaries. The routing cost function is designed so that routing a connection in a way that minimizes the cost function and increases the likelihood that the router will be able to successfully route all nets that have not yet been routed. After selecting the global route for a connection at step 18, the router establishes a detailed route for the connection defining the structures on each layer of the IC within each tile included in the global route (step 20). For example, FIG. 2C shows a detailed route for connection 34.

Figure 2D:
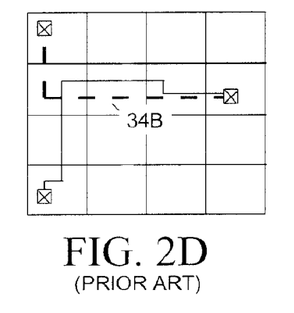
Figure 2E:
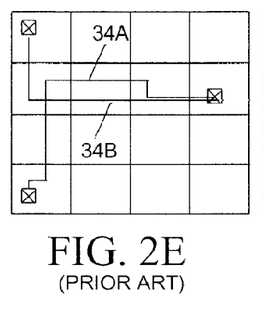
Figure 2F:
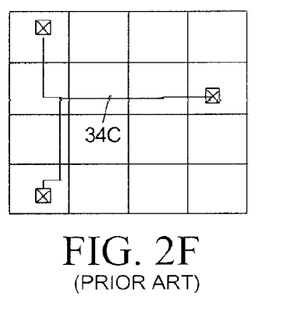

When there is a next connection of the selected net to be routed (step 22), the router selects the next connection (step 16) and then globally routes the next connection (step 18). FIG. 2D shows a global route for connection 31B of net 31 of FIG. 2A. At step 20, the router then tentatively establishes a detailed route for the connection and then refines the detailed routing to eliminate any redundancy. For example after establishing a tentative detailed route for connection 34B as illustrated in FIG. 2E, the algorithm refines the routing of connections 34A and 34B as shown in FIG. 2F by eliminating redundant routing in three of the tiles so that the follow the same path 34C where possible, thereby reducing congestion within the tiles and at tile boundaries. The router continues to repeat steps 16-20 until all connections of the selected net have been routed. When there is a next net to be routed (step 24) the algorithm selects the next net and repeats steps 14-22 to route all of its connections. The process continues until at step 24 the router has routed all nets.

Figure 3:
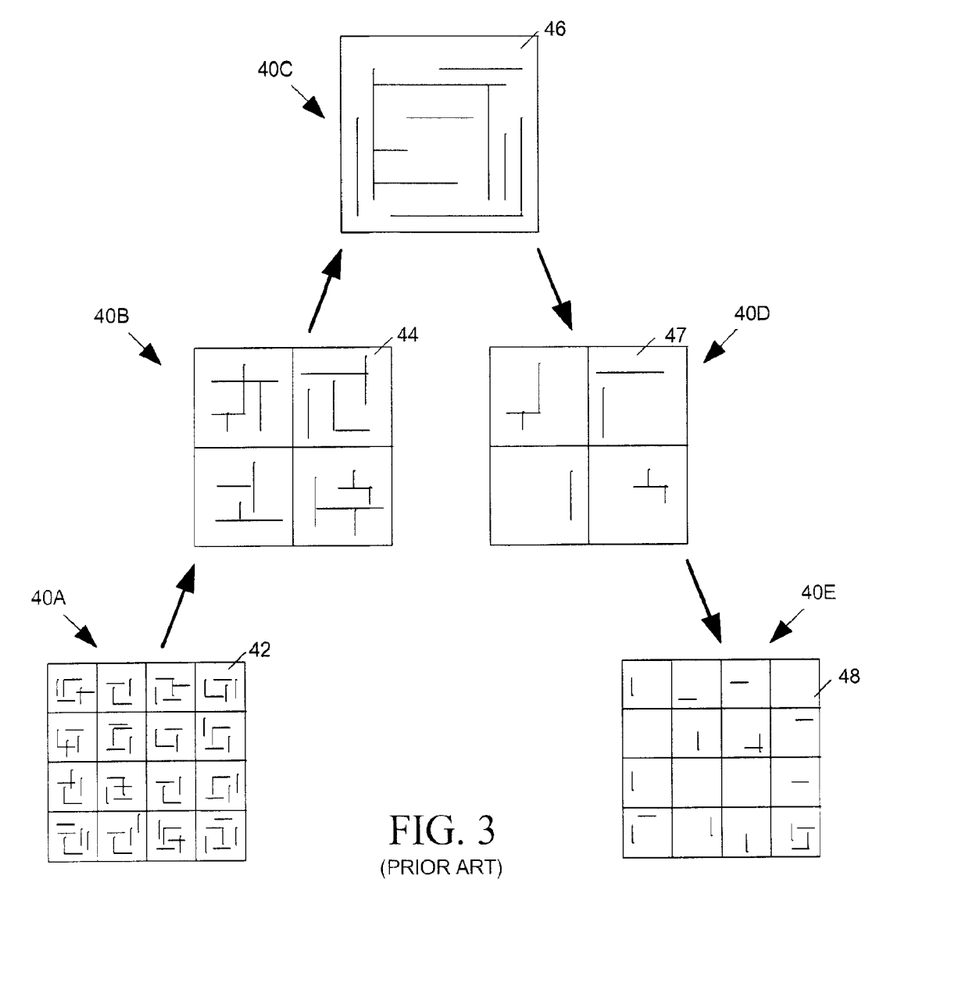
FIG. 3 graphically depicts stages of a prior art routing process.

As the number of nets the algorithm has routed increases, the available routing space decreases, and the algorithm of FIG. 1 becomes less likely to successfully route additional nets. To increase the likelihood of success, a prior art, multi-level "Λ-shaped", routing framework as illustrated in FIG. 3 carries out routing in several stages. The IC's floorspace is initially divided into an array 40A of relatively small tiles and a router separately routes each tile of the array 40A to find a detailed route for each net that resides completely within that tile. Nets crossing boundaries of tiles 42 are ignored and remain unrouted. At a next stage of the process the IC tiling is coarsened so that each set of four tiles 42 of array 40A are merged to create a single larger tile 44 of a tile array 40B. The router repeats the routing algorithm of FIG. 1 for each tile 44 but only the unrouted nets residing wholly within any individual tile 44 are routed; unrouted nets crossing boundaries of tiles 44 are ignored. Thus for each tile 44, connections for the unrouted nets residing wholly within that tile 44 are identified (step 12), and each such connection of each net is globally routed and detailed routed with respect to smaller tiles 42 (steps 14-24). When the algorithm is unable to route a net residing wholly within any given tile 44, it simply notes that it failed to route that net, and continues to route additional nets. At the next stage of the process, IC tiling is again coarsened so that each set of four tiles 44 of array 40B are merged to create a single larger tile 46 of a tile array 40C. In this simple example, the algorithm reaches the coarsest (single tile) stage in only two coarsening steps, but an IC layout may initially be divided into more tiles requiring more coarsening stages to reach the coarsest, single tile stage. The router then repeats the routing algorithm of FIG. 1 for tile 46 to determine a global and then a detailed route for each net crossing a boundary of a tile 44.

At this point, the algorithm will have attempted to route every net and will likely have succeeded in routing most of them. The algorithm then begins a series of uncoarsening stages. During the first uncoarsening stage, the algorithm divides the IC into an array 40D of four tiles 47 and finds a route for local nets within any tile 47, rerouting previously routed nets within that tile when necessary to provide a path for the net being routed. The algorithm then again un-coarsens the tiling to produce a new tile array 40E wherein each tile 47 of array 40D is divided into four smaller tiles 48. The algorithm then finds a route for each unrouted local net residing wholly within any tile 48, rerouting other local nets wholly within the tile as necessary to eliminate excessive congestion at tile boundaries. The routing process ends after the algorithm has reached the finest tiling level and has routed all nets.

The path delay through a net increases with its length, and nets can form signal paths that may be subject to restrictions on path delays. It is therefore helpful to route nets interconnecting widely spaced cells in as direct a manner as possible in order to limit the nets' contributions to signal path. Since the prior art Λ-shaped framework of FIG. 3 first routes shorter nets without considering the routing resource requirements of later routed longer nets, wrong routing choices with respect to short, local nets during the early stages of the process make routing of the more timing critical longer nets more difficult and can complicate and lengthen the refinement process carried out during the later stages of the process.

Prior art "grid-based" routing algorithms that route nets along pre-established grid lines treat all wires as having the same width and required spacing between wires. However grid-based routing algorithms are not suitable for routing modern ICs, where nanometer-scale optical fringing and other effects can influence net width and spacing, particularly since optical proximity correction (OPC) and phase-shift mask (PSM) procedures have been developed to adjust width and spacing of individual wires to correct for these influences. "Gridless" routing systems are preferable because they do not restrict wire routing to pre-established grid lines and can accommodate variations in wire width and spacing.

What is needed is a gridless routing algorithm that gives priority to routing longer signal paths but which, when routing any net, takes into account estimated routing resource requirements of all unrouted nets to minimize the impact on the routing resources that will be required by the later routed nets.

SUMMARY OF THE INVENTION

A computer-aided IC router carrying out a method in accordance with the invention selects routes for nets interconnecting terminals of circuit devices within an area of an integrated circuit. During an initial partitioning phase, the router iteratively partitions the area into progressively smaller tiles, until the tiles reach a predetermined minimum size. After each partitioning iteration, the router selects a route for each previously unrouted net that must pass between tiles when possible to do so without altering any previously routed net. During a merging phase carried out after the partitioning phase, the router iteratively merges tiles into progressively larger tiles until the tiles reach a predetermined maximum size. Before each merging iteration, the router selects a route for each previously unrouted net that need not pass between tiles and alters a route of any previously routed net when necessary to accommodate the selected route.

The router also partitions the IC area into an array of global routing cells (GRCs) and generates a congestion map providing a separate congestion factor $c_e$ corresponding to each boundary e between each adjacent pair of GRCs. Each congestion factor is a measure of an estimated percentage of a capacity of the corresponding GRC boundary to accommodate nets passing through the GRC boundary that will be consumed when all nets have been routed. Each congestion factor $c_e$ corresponding to a GRC boundary is initially a sum of estimated contributions of all nets to that congestion factor, wherein for each boundary e between an adjacent pair of GRCs, $$c_e = d_e/p_e$$

where $p_e$ is a function of a length of the GRC boundary, and $d_e$ is an estimated sum of the width of nets to be routed through the corresponding GRC boundary and required space between those nets.

Whenever the router selects a route for an connection of a net during the partitioning or merging phase, it selects a route that minimizes a cost function that is an increasing function of a maximum congestion factor $c_e$ of any GRC boundary the connection passes through and an increasing function of an average congestion factor $c_e$ of all GRC boundaries the connection passes through. Upon selecting any connection route, the computer modifies the congestion map to reflect changes in routing probabilities occasioned by the route selection.

The router selects a route for each connection by first selecting a sequence of GRCs that the connection is to pass through that minimizes the cost function of congestion factors $c_e$ provided by the congestion map, and then selecting a detailed route specifying a path the connection follows through each tile the route passes through.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a method implemented by a computer-aided router for routing nets for interconnecting terminals of cell instances within an integrated circuit (IC) layout. The invention is suitably implemented in the form of software residing on computer-readable media which when read and executed by a conventional computer causes the computer to act as a router, selecting routes for nets interconnecting terminals within an IC described by a netlist given positions of those terminals. Suitable computer-readable media for storing the software may be, for example, compact disks, hard disks, floppy disks, read only memory, and random access memory. While the drawings and specification below describe in detail a best mode of practicing the invention recited in the claims appended to this specification, they do not necessarily describe all possible modes of practicing the invention. For example, although various method steps are detailed below to clearly describe the best mode, those of skill in the art will appreciate that alternative ways of carrying out each step may be possible. The invention recited in the claims is therefore not necessarily limited to methods incorporating every detail described below.

Figure 4:
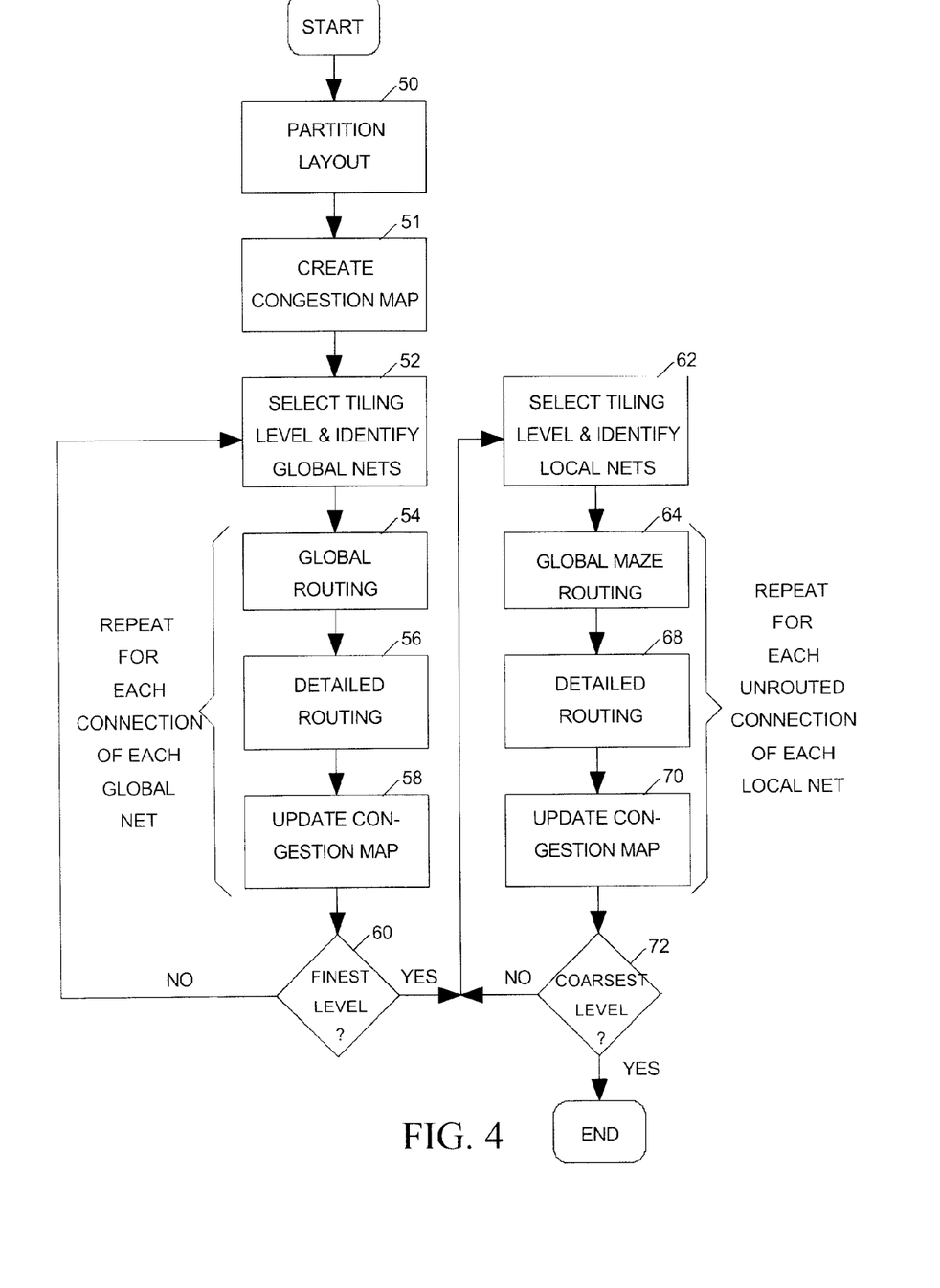
FIG. 4 is a flow chart depicting an example routing method in accordance with the invention.

FIG. 4 is a flow chart depicting an algorithm employed by a router in accordance with the invention for processing a placement plan indicating a position of each cell instance of an IC described by a netlist as being formed by a set of cell instances interconnected by nets to produce a routing plan for the IC specifying the routes for all nets interconnecting terminals of the cell instances. The routing algorithm of FIG. 4 is suitably incorporated into routing software residing on computer-readable media such, for example, a compact disk, a hard disk, and/or computer memory that is read and executed by a conventional computer having access to the netlist and to the placement plan.

To meet constraints on signal path delays, it is preferable for nets interconnecting the most widely spaced cell instances to follow the most direct routes, thereby to limit signal delays through the longer nets. Therefore, as discussed below, the routing algorithm of FIG. 4 is designed to route nets interconnecting more widely spaced cell instances before attempting to route nets interconnecting more closely spaced cell instances, thereby improving the probability that the longer nets will be routed more directly. The later routed shorter nets may follow more circuitous routes in order to avoid the earlier routed longer nets, but the increased path lengths of the shorter routes are less likely to contribute to timing constraint violations.

Even though earlier routed nets are likely to follow more direct paths, when routing any individual net, the routing algorithm not only avoids conflicts with previously routed nets, it also takes into account estimated routing resource requirements of all unrouted nets to help avoid conflicts with later routed nets. In particular, the algorithm estimates the routing requirements of all nets in each area of an IC and then routes each net in a way that tends to reduce the impact on areas that are expected to become more congested as more nets are routed. This helps to reduce the likelihood of routing conflicts that must be resolved in the later stages of the routing process, a beneficial result since resolving routing conflicts can be time consuming.

Congestion Map

Figures 5, 6, 7A, 7B:
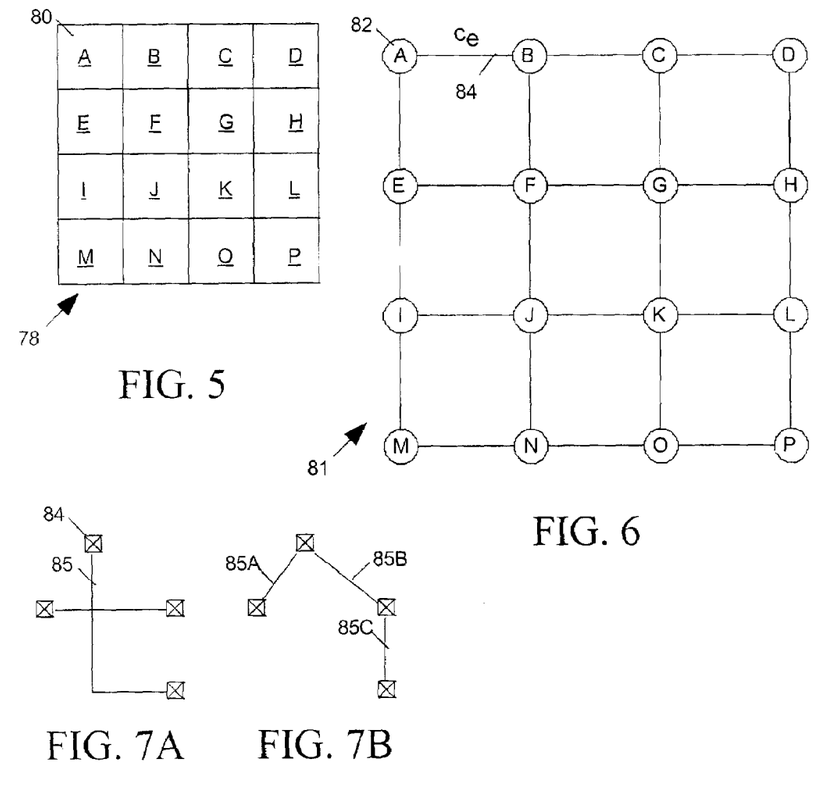
FIG. 5 graphically depicts an array of global routing cells established by a routing method in accordance with the invention.
FIG. 6 graphically depicts a congestion map created by a routing method in accordance with the invention.
FIGS. 7A and 7B graphically depict a net interconnecting a set of terminals.

A router implementing the routing algorithm of FIG. 4 initially (step 50) partitions the layout into a rectangular grid 78 of "global routing cells" (GRCs) 80 as illustrated in FIG. 5. In this simple example, the router has partitioned the IC into only 16 GRCs 80 (A-P) but in practice the initial grid can include a much larger number of GRCs, with each GRC small enough to encompass no more than a specified small number of cell instances.

The router then creates a "congestion map" in the form of a graph 81 as illustrated in FIG. 6 (step 51), where each node 82 represents a separate GRC 80 of grid 78 and each edge 84 of graph 81 represents the boundary between two adjacent GRCs 80. The router also estimates a "congestion" factor $c_e$ for each edge e corresponding to a GRC-to-GRC boundary as $$c_e = d_e/p_e$$

where

"capacity" $p_e$ is the width of the GRC boundary associated with edge e, and

"channel" density $d_e$ is the sum of the width and its spacings of nets routed through the corresponding boundary.

Figure 8A:
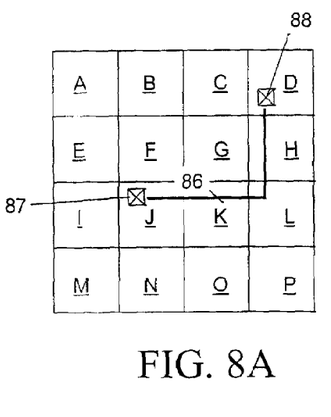
FIGS. 8A and 8B graphically depict alternative routes of a net between two terminals.
Figure 8B:
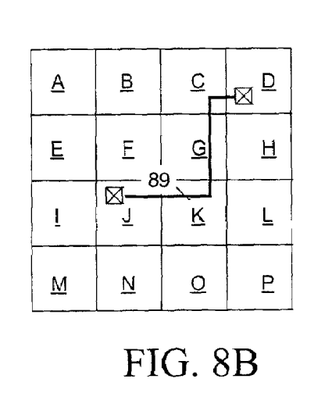

The router initially estimates channel density $d_e$ by first executing a conventional "minimum spanning tree" (MST) algorithm which processes the netlist to determine the topological endpoints of each net, each of which interconnects two or more cell terminals. The router then decomposes each net into a set of one or more "connections" wherein each connection interconnects only two cell terminals. For example, FIG. 7A shows four cell terminals 84 interconnected by a net 85 which can be decomposed into three connections 85A-C as illustrated in FIG. 7B. For each connection, the router then determines each possible L-shaped or Z-shaped route the connection may follow between the two terminals it interconnects. For example, FIG. 8A shows one possible L-shaped route 86 between two terminals 87 and 88 and FIG. 8B shows one possible Z-shaped route 89 between the two terminals. There are a total of four possible Z-shaped or L-shaped routes between cell terminals 87 and 88.

Upon determining the total number $n_c$ of L-shaped and Z-shaped routes for a given connection c, the router estimates each connection's contribution to the channel density $d_e$ of any edge e corresponding to a GRC boundary that any one of its possible routes passes through as $$d_e = w_c/n_c$$

where the "wire density" $w_c$ of channel c is the sum of its wire width and its required spacing from other nets. Thus for the example connection between cell terminals 87 and 88 of FIGS. 8A and 8B, where $n_c=4$, the contribution of one route 86 to the estimated channel density $d_e$ of the boundary between GRCs J and K is $w_c/4$. That route also contributes the same amount to the channel densities of the boundaries between GRC's K and L, GRC's L and H, and GRC's H and D. Route 89 of FIG. 8B contributes a similar amount to the estimated channel densities of the GRC boundaries it passes through. After computing the contribution of each possible route for every connection to the channel density $d_e$ of each GRC boundary, the router sums the contributions to determine that channel density $d_e$, and divides the result by the boundary capacity $p_e$ to produce an initial estimate of the congestion $c_e$ at the boundary between each pair of adjacent GRCs associated with an edge e of the congestion map of FIG. 6.

Thus at step 51 of FIG. 4 a congestion factor $c_e$ is computed for each edge 84 of graph 81 of FIG. 6 corresponding to each GRC boundary. The congestion factor for each edge is the sum of estimated contributions of all nets that may cross the corresponding GRC boundary. The contribution for each net is a function of an estimated probability that the net will pass through that GRC boundary and of the width and required spacing of the net. The congestion map therefore provides a separate congestion factor $c_e$ for each boundary between each adjacent pair of GRCs that is a measure of an estimated percentage of the capacity of that boundary to accommodate nets passing through the boundary that will be consumed when all nets have been routed.

Figure 9:
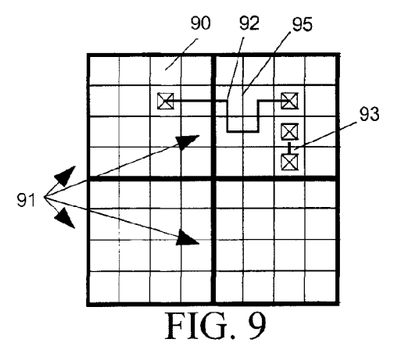
FIG. 9 graphically depict connections routed through an array of global routing cells.
Figure 10:
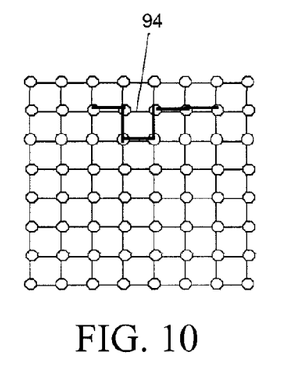
FIG. 10 depicts a congestion map corresponding to the array of global routing cells of FIG. 9.

The routing algorithm of FIG. 4 is biased toward routing nets connecting more widely spaced cell terminals before connecting nets connecting less widely spaced cell terminals. Suppose, for example, that the algorithm initially partitions the IC into an 8×8 grid of GRCs 90 as illustrated in FIG. 9 when creating the congestion map at step 51 of FIG. 4 and produces an 8×8 congestion map as illustrated in FIG. 10. If the algorithm subdivides the GRC grid of FIG. 9 into four tiles 91, each spanning an array of 16 GRCs 90, then any net 92 that must interconnect cell terminals residing in different tiles 91 is more likely to be longer than a net 93 interconnecting cell terminals residing wholly within a single tile 91. Thus if the algorithm routes nets that cross the boundaries of tiles 91 first, before routing any net that reside wholly within any one tile 91, then the algorithm will tend to route longer nets first.

Figure 11:
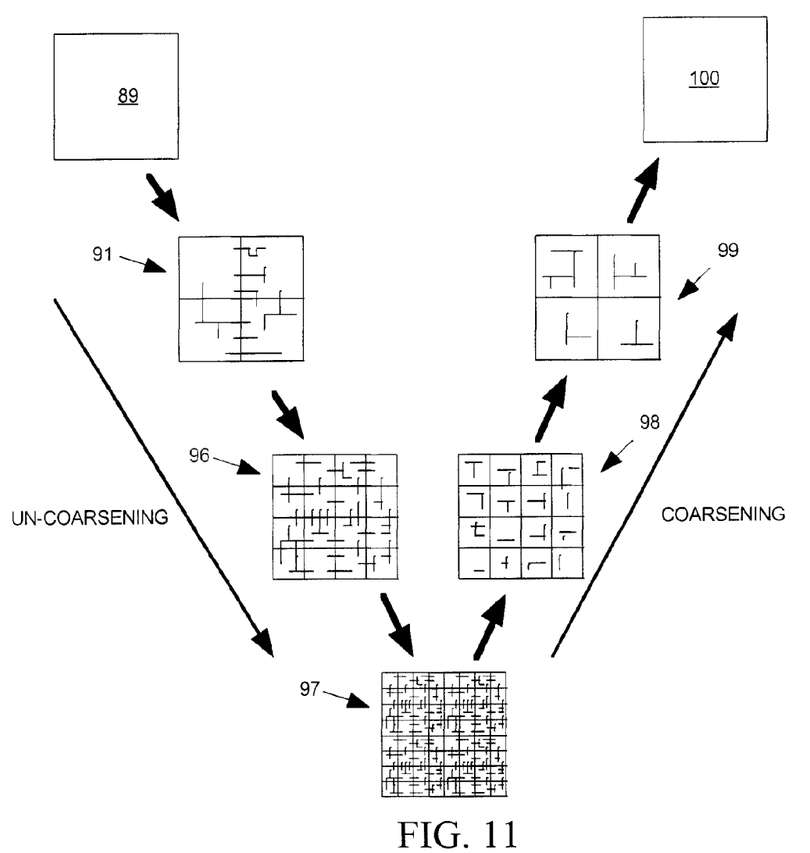
FIG. 11 graphically depicts stages of the example routing method in accordance with the invention.

Accordingly, as illustrated in FIG. 11, the routing algorithm of FIG. 4 initially divides the IC layout area 89 into a grid of four tiles 91 (step 52). The algorithm also processes the placement plan and the netlist to determine for a current uncoarsening stage which nets are "global nets" that pass through boundaries of tiles 91 (but not through boundaries of tile of any preceding coarsening stage) and which nets are "local nets" residing wholly within a single one of tiles 91 (but not wholly within a single tile of a next coarsening stage). Selecting each global net in turn, the algorithm first finds a global route for each connection of the net by processing congestion map 10 to determine a route though GRCs 90 having the lowest channel congestion cost as determined by a cost function. For a given connection route, Re={e∈E₀| where e is the edge chosen for routing}, the algorithm applies the following cost function:

$$\alpha(R_e) = \max_{e \in R_e} c_e + \frac{1}{|R_e|} \sum_{e \in R_e} c_e,$$

where
$c_e$ is the congestion of tile edge e as defined above, and
$R_e$ is a proposed net routing.

The first term of the expression renders the cost of a given connection route $R_e$ a function of the maximum estimated congestion $c_e$ of any GRC boundary the connection crosses as indicated by the congestion map of FIG. 10 which, as discussed above, provides an estimated channel density $c_e$ for each GRC boundary corresponding to a graph edge. The second term of the cost function renders the cost of a given connection route $R_e$ also a function of the sum of congestions $c_e$ of all of the GRC boundaries the connection route passes through, divided by the length $|R_e|$ of the route. Thus the cost function is also biased toward routing a connection more directly so that it passes through fewer and less congested GRC boundaries.

For example, as illustrated in FIG. 9, the lowest cost route for the connection of net 92 may not be a direct path between the cell terminals it interconnects when the congestion map of FIG. 10 shows that the edge 94 corresponding to GRC-to-GRC boundary 95 is expected to be highly congested. Since in this case the savings associated with routing the connection around boundary 95 rather than through it exceeds the expense associated with routing the connection through more GRC-to-GRC boundaries, the router chooses a less direct route for the connection even when no other nets have yet been routed through that boundary.

Thus even though net 92 may be the first net that the algorithm routes, the algorithm is not free to simply choose the most direct route, but must instead take into account the estimated future routing needs of nets the algorithm has yet to route. Those future routing needs are incorporated into the cost function in the form of the congestion value $c_e$ associated with each GRC-to-GRC boundary.

The algorithm thus establishes (at step 54) a global route for a connection of a net by selecting the set of GRCs the route passes through for which the cost function has a lowest value. The algorithm then establishes a detailed route for the connection (step 56) by selecting the exact route the connection follows through each routing layer of each GRC. At step 58, the connection map is updated to account for the contribution to congestion at each GRC boundary caused by the actual route of the connection. As discussed above, when the congestion map is created at step 51, that connection's contribution to congestion was prorated among all of the GRC boundaries through which the connection might have been routed when following a Z-shaped or L-shaped path. Now that the algorithm has selected an actual path for the connection, it updates the congestion map to account for the change in probability that a connection will pass through any given GRC boundary that routing the net has caused. For example, referring to FIGS. 8A and AB, if the router selects route 86, then the probability that it pass through the (H,L) GRC boundary is now 1, rather than ($1/n_c$) and the probability that it will pass through the (G,K) GRC boundary is now 0, rather than ($1/n_c$). Thus at step 58, the algorithm subtracts the estimated partial contribution ($w_c/n_c$) of that connection from the congestion factor $c_e$ for every GRC boundary that previously included it, and adds the full contribution ($w_c$) of that connection to the congestion factor $c_e$ of every GRC boundary through which the connection is now routed. The router therefore dynamically updates the congestion map at step 58 each time it chooses a connection route so that the congestion information the map provides becomes an increasingly more accurate predictor of GRC boundary congestion and, accordingly, an increasingly better guide for routing previously unrouted nets.

The algorithm repeats steps 54-58 of FIG. 4 for each connection of a global net to establish a detailed route for that connection. As illustrated in FIGS. 2A-2F, consistent with prior art practice, when the algorithm has routed more than one connection of a net, as shown for example in FIG. 2E, it refines the detailed routing at step 56 as shown for example in FIG. 2F when it is possible to combine segments of the two connections that pass through the same GRC and reflects this refinement when it updates the congestion map at step 58.

The algorithm continues to loop through steps 54-58 until it has selected a detailed route for every section of every global net having at least one connection crossing a boundary of any tile 91. Note that at this point, the algorithm will have established a route for every net crossing a boundary of a tile 91 but will not have attempted to select a route for any net residing wholly within any one of tiles 91.

If the algorithm has not routed connections at the finest tiling level (step 60), the algorithm returns to step 52 to establish a finer (less coarse) tiling level. At step 52 the algorithm divides each tile 91 into four smaller tiles 96 (FIG. 11) such that unrouted nets crossing the boundaries of tiles 96 now become global nets. The algorithm then repeats steps 54-58 of FIG. 4 for each unrouted global net to attempt to establish global and detailed routes for each connection of that net. Since the algorithm will not route a connection through a GRC boundary if doing so causes the boundary's channel density $d_e$ to exceed its capacity $p_e$, it is possible that the algorithm may not be able to establish routes for one or more connections of a global net due to congestion caused by previously routed connections, and in such case the algorithm simply makes note of the fact that it has failed to route the connection and continues repeating steps 54-58 until it has routed, or attempted to route all connections of all global nets. Thus some connections of some global nets may remain unrouted at this point.

After attempting to route all connections of all global nets crossing boundaries of tiles 96 the algorithm again returns to step 52 to establish a still finer tiling level by horizontally dividing each tile 96 into four smaller tiles 97 (FIG. 11), identifying global nets including at least one connection crossing a boundary of any one of tiles 9, and then repeating steps 54-58 of FIG. 4 to attempt to establish global and detailed routes for every unrouted connection of each global net.

When tiling resolution now matches the resolution of the congestion map (FIG. 9) the algorithm determines (step 60) after routing the last connection of the last global net that it has reached the finest tiling level. At this point, the algorithm will have or attempted to have routed every connection of every net other than local nets residing wholly within individual tiles 97. Next (step 62) the algorithm initially selects the same finest tiling level and identifies each local net residing wholly within a tile 97 (step 62) and then repeats a set of steps 64, 66 and 68 for each connection of each unrouted local net residing wholly within any tile 97. In step 64 the algorithm performs global maze routing in which it first establishes a lowest cost global route for the connection, even though the route may cause the channel density of one or more edges of the GRCs 90 of FIG. 9 to exceed their capacity. When the route exceeds any GRC boundary's capacity, the algorithm selects a connection of a previously routed net passing though that GRC boundary and looks for a lowest cost route for that connection that bypasses that particular GRC boundary and which does not cause the channel density of any other GRC boundary to exceed its capacity. The algorithm may attempt to reroute more than one connection in order to resolve the capacity overflow. After establishing the global route for the local net connection, and after establishing new global routes for any connections it had to reroute at step 64, the algorithm establishes detailed routing for those connections (step 68) and then updates the congestion map to reflect the routing changes (step 70).

As illustrated in FIG. 11, if the algorithm has not reached the coarsest tiling level (step 72) the algorithm selects a next coarser tiling level (step 62) in which each tile 98 spans an area covered by four tiles 97 at the last tiling level and repeats steps 64, 66 and 68 for each unrouted connection of a net that is local to any tile 97 to select global and detailed routes for each connection, rerouting previously routed connections at steps 63 and 68 when necessary to resolve any congestion conflicts. Thereafter, if the algorithm has not reached the coarsest tiling level (step 72) the algorithm next selects a next coarser tiling level (step 62) in which each tile 99 spans an area covered by four tiles 99 at the previous tiling level and iteratively executes steps 64, 66 and 68 to establish global and detailed routes for each previously unrouted connection of each net that is local to an tile 97, rerouting previously routed connections when necessary to resolve any congestion conflicts. The routing process continues to step though progressively coarser tiling levels until at step 72 it determines it has reached the coarsest tiling level 100, at which point the algorithm, if successful, will have routed all connections of all nets.

Note that in this simple example there are only four tiling levels, but for a typical IC the algorithm may pass through many more tiling levels during its un-coarsening and coarsening stages.

The routing method described above thus follows the "V-shaped framework" depicted in FIG. 11, wherein tiling starts at the coarsest level and moves to the finest level during an "un-coarsening phase" and then back to the coarsest level during a "coarsening phase". Since the V-shaped framework is biased toward routing the longest nets first, it tends to make the longest nets as direct (and therefore as short) as possible, thereby helping to minimize signal path delays in the longer nets that are more likely to violate timing constraints.

By creating and dynamically updating the congestion map each time it routes a connection, and by using the above-described cost function based on the congestion estimates provided by the congestion map to guide global route selection, a routing method in accordance with the invention helps to reduce the likelihood that a route selected during an early stage of the process will conflict with route selections during later stages. Limiting the number of routing conflicts that have to be resolved by the time-consuming maze router during the coarsening phase of the process helps speed up the routing process.

Three-dimensional Routing

Figure 12:
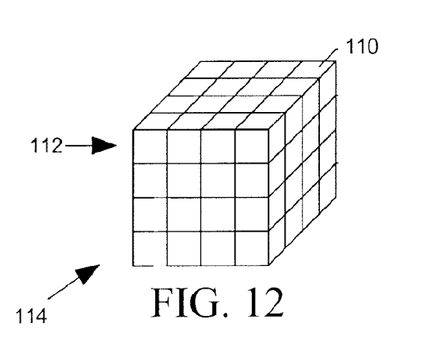
FIG. 12 graphically depicts a three-dimensional array of global routing cells.

Nets are implemented using conductors (wires) formed on two or more layers of an IC and by conductive vias passing vertically between wires formed on different layers. For simplicity FIG. 5 depicts GRCs 80 as two-dimensional rectangles and depicts the congestion map of FIG. 6 as a two-dimensional graph. However, referring to FIG. 18, the router views each GRC 110 as a three-dimensional block, represents each routing layer of an IC as a two-dimensional array 112 of such three-dimensional GRCs 110, and represents the various routing layers as a three-dimensional array 114 of GRCs 110. Thus each GRC 110 may be bounded by from three to six other GRCs as illustrated in FIG. 12.

Figure 13:
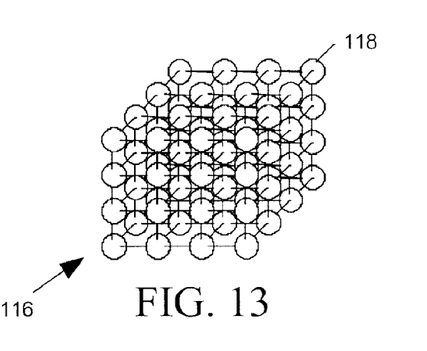
FIG. 13 graphically depicts a congestion map corresponding to the global routing cell array of FIG. 12.

Referring to FIG. 13, the algorithm's congestion map for the three-dimensional GRC array 114 of FIG. 13 is a three-dimensional graph 116, wherein each node 118, corresponds to a separate GRC block 110. The capacity $c_e$ of a boundary between two adjacent GRC blocks 110 is a function of the capacity and estimated wire density of wires formed on an IC layer that will pass through that boundary. The capacity $c_e$ of a boundary between two vertically adjacent GRCs is a function of the capacity and estimated density of vias passing between adjacent IC routing layers that will pass through that boundary. Referring to FIG. 11, although the GRCs 89-100 are three-dimensional, the algorithm need subdivide or merge tiles only in the horizontal plane when stepping through the uncoarsening and uncoarsening stages.

Thus has been shown and described a V-shaped multilevel gridless routing system for routing nets within an integrated circuit (IC). The method gives priority to routing longer signal paths first to keep them more direct, but when routing any net, the method takes into account estimated routing resource requirements of all unrouted nets to minimize the impact on the routing resources needed by the later routed nets. This helps to reduce the likelihood of routing conflicts that must be resolved in the later stages of the routing process, thereby reducing the time required to resolve routing conflicts.

The invention claimed is:

1. A method for selecting routes for nets interconnecting terminals of circuit devices within an area of an integrated circuit, the method comprising the steps of:

a. iteratively partitioning the area into progressively smaller tiles utilizing a computer, at least three times, until the tiles reach a predetermined minimum size,
b. after each partitioning iteration at step a, selecting each net that must pass between tiles and has not yet been routed, determining whether each selected net can be routed without altering routing of any previously routed net and, if so, selecting a route for the selected net,
c. following step b, iteratively merging tiles into progressively larger tiles at least three times until the tiles reach a predetermined maximum size; and
d. before each merging iteration at step c, selecting each net that need not pass between tiles and has not yet been routed, determining whether each selected net can be routed if routing of a previously routed net is altered and, if so, altering the routing of said previously routed net to accommodate a route for the selected net and selecting a route for said selected net.

2. The method in accordance with claim 1 further comprising the steps of:
e. partitioning the area into an array of global routing cells (GRCs), and
f. generating a congestion map providing a separate congestion factor $c_e$ corresponding to each boundary e between each adjacent pair of GRCs,
wherein each congestion factor is a measure of an estimated percentage of a capacity of the corresponding GRC boundary to accommodate nets passing through the GRC boundary that will be consumed when all nets have been routed,
wherein each selection of a net route at steps b and d is guided by a consideration of the congestion factors provided by the congestion map.

3. The method in accordance with claim 2,
wherein each congestion factor $c_e$ corresponding to a GRC boundary is initially a sum of estimated contributions of all nets to that congestion factor,
wherein the estimated contribution of each net to each congestion factor is a function of a probability the net will pass through the GRC boundary.

4. The method in accordance with claim 2, wherein the estimated contribution of each net to each congestion factor is also a function of a width of the net, and of a required spacing of that net from other nets.

5. The method in accordance with claim 4 wherein for each boundary e between an adjacent pair of GRCs, $$c_e = d_e/p_e$$

where
$p_e$ is a function of a length of the GRC boundary, and
$d_e$ is an estimated sum of the width of nets to be routed through the corresponding GRC boundary and required space between those nets.

6. The method in accordance with claim 2 wherein each net comprises at least one connection between terminals, the method further comprising the step of:
g. modifying congestion factors provided by the congestion map whenever a route is selected for a connection of any net at one of steps b and d to reflect changes in routing probabilities occasioned by the route selection.

7. The method in accordance with claim 6
wherein a route for each connection of each net routed at steps b and d is selected so as to minimize a cost function of the congestion factors $c_e$ provided by the congestion map.

8. The method in accordance with claim 7 wherein the cost function for each connection is an increasing function of a maximum congestion factor $c_e$ of any GRC boundary the connection passes through.

9. The method in accordance with claim 7 wherein the cost function for each connection is an increasing function of an average congestion factor $c_e$ of all GRC boundaries the connection passes through.

10. The method in accordance with claim 9 wherein the cost function for each connection is also an increasing function of a maximum congestion factor $c_e$ of any GRC boundary a connection passes through.

11. The method in accordance with claim 6 wherein at step b or d, selecting a route for each net is carried out by selecting a route for each connection of the net, and
wherein selecting each connection's route is carried out by first selecting a global route as a sequence of GRCs the connection is to pass through that minimizes a cost function of congestion factors $c_e$ provided by the congestion map, and then selecting a detailed route specifying a path the connection follows through each GRC included in the global route.

12. The method in accordance with claim 1 comprising partitioning the area into an array of global routing cells (GRCs), and wherein each net comprises at least one connection between terminals, selecting a route for said selected net at step b or d comprises selecting a route for each connection of the net, and selecting a route for a connection is carried out by first selecting a global route as a sequence of GRCs the connection is to pass through and then selecting a detail route specifying a path the connection follows through each GRC included in the global route.

13. A computer-readable storage device storing software which when read and executed by a computer causes the computer to carry out a method for selecting routes for nets interconnecting terminals of circuit devices within an area of an integrated circuit, wherein the method comprises the steps of:
a. iteratively partitioning the area into progressively smaller tiles, at least three times until the tiles reach a predetermined minimum size,
b. after each partitioning iteration at step a, selecting each net that must pass between tiles and has not yet been routed, determining whether each selected net can be routed without altering routing of any previously routed net and, if so, selecting a route for the selected net,
c. following step b, iteratively merging tiles into progressively larger tiles at least three times until the tiles reach a predetermined maximum size; and
d. before each merging iteration at step c, selecting each net that need not pass between tiles and has not yet been routed, determining whether each selected net can be routed if routing of a previously routed net is altered and, if so, altering the routing of said previously routed net to accommodate a route for the selected net and selecting a route for said selected net.

14. The computer-readable storage device in accordance with claim 13 wherein the method further comprises the steps of:
e. partitioning the area into an array of global routing cells (GRCs), and
f. generating a congestion map providing a separate congestion factor $c_e$ corresponding to each boundary e between each adjacent pair of GRCs,
wherein each congestion factor is a measure of an estimated percentage of a capacity of the corresponding GRC boundary to accommodate nets passing through the GRC boundary that will be consumed when all nets have been routed, wherein each selection of a net route at steps b and d is guided by a consideration of the congestion factors provided by the congestion map.

15. The computer-readable storage device in accordance with claim 14, wherein each congestion factor $c_e$ corresponding to a GRC boundary is initially a sum of estimated contributions of all nets to that congestion factor, wherein the estimated contribution of each net to each congestion factor is a function of a probability the net will pass through the GRC boundary.

16. The computer-readable storage device in accordance with claim 14, wherein the estimated contribution of each net to each congestion factor is also a function of a width of the net, and of a required spacing of that net from other nets.

17. The computer-readable storage device in accordance with claim 16 wherein for each boundary e between an adjacent pair of GRCs, $$c_e = d_e/p_e$$

where $p_e$ is a function of a length of the GRC boundary, and $d_e$ is an estimated sum of the width of nets to be routed through the corresponding GRC boundary and required space between those nets.

18. The computer-readable storage device in accordance with claim 15 wherein each net comprises at least one connection between terminals, the method further comprising the step of:

g. modifying congestion factors provided by the congestion map whenever a route is selected for a connection of any net at one of steps b and d to reflect changes in routing probabilities occasioned by the route selection.

19. The computer-readable storage device in accordance with claim 18 wherein a route for each connection of each net routed at steps b and d is selected so as to minimize a cost function of the congestion factors $c_e$ provided by the congestion map.

20. The computer-readable storage device in accordance with claim 19 wherein the cost function for each connection is an increasing function of a maximum congestion factor $c_e$ of any GRC boundary the connection passes through.

21. The computer-readable storage device in accordance with claim 19 wherein the cost function for each connection is an increasing function of an average congestion factor $c_e$ of all GRC boundaries the connection passes through.

22. The computer-readable storage device in accordance with claim 21 wherein the cost function for each connection is also an increasing function of a maximum congestion factor $c_e$ of any GRC boundary a connection passes through.

23. The computer-readable storage device in accordance with claim 18 wherein at step b or d, selecting a route for each net is carried out by selecting a route for each connection of the net, and wherein selecting each connection's route is carried out by first selecting a global route as a sequence of GRCs the connection is to pass through that minimizes a cost function of congestion factors $c_e$ provided by the congestion map, and then selecting a detailed route specifying a path the connection follows through each GRC included in the global route.

24. The computer-readable storage device in accordance with claim 13 wherein each net comprises at least one connection between terminals, the method comprises partitioning the area into an array of global routing cells (GRCs), selecting a route for said selected net at step b or d comprises selecting a route for each connection of the net, and selecting a route for a connection is carried out by first selecting a global route as a sequence of GRCs the connection is to pass through and then selecting a detail route specifying a path the connection follows through each GRC included in the global route.

* * * * *